US010163865B2

(12) United States Patent
　　　Chen

(10) Patent No.: US 10,163,865 B2
(45) Date of Patent: *Dec. 25, 2018

(54) INTEGRATED CIRCUIT PACKAGE ASSEMBLY

(71) Applicant: Taiwan Semiconductor Manufacturing Co., Ltd., Hsin-Chu (TW)

(72) Inventor: Hsien-Wei Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/716,959

(22) Filed: Sep. 27, 2017

(65) Prior Publication Data

US 2018/0019229 A1　　Jan. 18, 2018

Related U.S. Application Data

(60) Continuation of application No. 14/818,877, filed on Aug. 5, 2015, now Pat. No. 9,786,635, which is a (Continued)

(51) Int. Cl.
　　*H01L 25/065*　　(2006.01)
　　*H01L 23/00*　　(2006.01)
　　*H01L 25/10*　　(2006.01)

(52) U.S. Cl.
　　CPC ......... *H01L 25/0657* (2013.01); *H01L 24/11* (2013.01); *H01L 24/81* (2013.01);
(Continued)

(58) Field of Classification Search
　　CPC ............... H01L 25/0657; H01L 24/81; H01L 2224/73265; H01L 2225/1058;
(Continued)

(56) References Cited

U.S. PATENT DOCUMENTS 6,847,105 B2　　1/2005　Koopmans
2005/0199992 A1　9/2005　Baek et al.
(Continued)

OTHER PUBLICATIONS

Non-Final Office Action dated Jan. 3, 2014 for U.S. Appl. No. 13/353,644.
(Continued)

*Primary Examiner* — Sonya D. McCall-Shepard
(74) *Attorney, Agent, or Firm* — Eschweiler & Potashnik, LLC

(57) ABSTRACT

An integrated circuit package assembly includes a first integrated circuit package and a second integrated circuit package. The first integrated circuit package includes a first integrated circuit die mounted on a first substrate. The second integrated circuit package includes a second integrated circuit die mounted on a second substrate. The second integrated circuit package is disposed under the first integrated circuit package. Solder bumps are disposed between the first integrated circuit package and the second integrated circuit package and provide electrical signal connections between the first integrated circuit die and the second integrated circuit die. A buffer layer is disposed between the first substrate and the second integrated circuit die to facilitate thermal conduction between the first integrated circuit package and the second integrated circuit package.

20 Claims, 7 Drawing Sheets

Related U.S. Application Data continuation of application No. 14/534,838, filed on Nov. 6, 2014, now Pat. No. 9,123,824, which is a division of application No. 13/353,644, filed on Jan. 19, 2012, now Pat. No. 8,907,469.

(52) U.S. Cl.
CPC ............ *H01L 25/105* (2013.01); *H01L 24/16* (2013.01); *H01L 24/32* (2013.01); *H01L 24/45* (2013.01); *H01L 24/48* (2013.01); *H01L 24/73* (2013.01); *H01L 2224/16225* (2013.01); *H01L 2224/27* (2013.01); *H01L 2224/2929* (2013.01); *H01L 2224/29299* (2013.01); *H01L 2224/32145* (2013.01); *H01L 2224/32225* (2013.01); *H01L 2224/45124* (2013.01); *H01L 2224/45144* (2013.01); *H01L 2224/45147* (2013.01); *H01L 2224/48227* (2013.01); *H01L 2224/48464* (2013.01); *H01L 2224/73204* (2013.01); *H01L 2224/73253* (2013.01); *H01L 2224/73265* (2013.01); *H01L 2224/81801* (2013.01); *H01L 2224/83191* (2013.01); *H01L 2224/94* (2013.01); *H01L 2225/06513* (2013.01); *H01L 2225/1023* (2013.01); *H01L 2225/1058* (2013.01); *H01L 2225/1094* (2013.01); *H01L 2924/00* (2013.01); *H01L 2924/00012* (2013.01); *H01L 2924/00014* (2013.01); *H01L 2924/15311* (2013.01); *H01L 2924/15321* (2013.01); *H01L 2924/181* (2013.01)

(58) Field of Classification Search
CPC ... H01L 2225/1094; H01L 2924/15321; H01L 24/73; H01L 24/11; H01L 25/105; H01L 2924/00; H01L 24/45; H01L 2924/181; H01L 2225/06513; H01L 2224/48227; H01L 2224/94; H01L 2224/83191; H01L 24/32; H01L 24/16; H01L 2924/15311; H01L 2224/73253; H01L 2224/32145

See application file for complete search history.

(56) References Cited

U.S. PATENT DOCUMENTS

| | | |
|---|---|---|
| 2006/0249852 A1 | 11/2006 | Chiu et al. |
| 2007/0289127 A1 | 12/2007 | Hurwitz et al. |
| 2008/0036050 A1 | 2/2008 | Lin et al. |
| 2009/0057864 A1 | 3/2009 | Choi et al. |
| 2009/0146315 A1 | 6/2009 | Shim et al. |
| 2011/0298119 A1 | 12/2011 | Cho et al. |
| 2012/0074589 A1 | 3/2012 | Mardi et al. |
| 2012/0161315 A1 | 6/2012 | Lin et al. |
| 2012/0228753 A1* | 9/2012 | Ko .................... H01L 23/3128 257/667 |

OTHER PUBLICATIONS

Final Office Action dated May 15, 2014 for U.S. Appl. No. 13/353,644.
Notice of Allowance dated Aug. 1, 2014 for U.S. Appl. No. 13/353,644.
Non-Final Office Action dated Dec. 29, 2014 for U.S. Appl. No. 14/534,838.
Notice of Allowance dated Apr. 24, 2015 for U.S. Appl. No. 14/534,838.
Non-Final Office Action dated Aug. 4, 2016 for U.S. Appl. No. 14/818,877.
Non-Final Office Action dated Dec. 30, 2016 for U.S. Appl. No. 14/818,877.
Notice of Allowance dated Jun. 6, 2017 for U.S. Appl. No. 14/18,877.

\* cited by examiner

INTEGRATED CIRCUIT PACKAGE ASSEMBLY

REFERENCE TO RELATED APPLICATIONS

This Application is a Continuation of U.S. application Ser. No. 14/818,877 filed on Aug. 5, 2015, which is a Continuation of U.S. application Ser. No. 14/534,838 filed on Nov. 6, 2014 (now U.S. Pat. No. 9,123,824 issued on Sep. 1, 2015), which is a Divisional of U.S. application Ser. No. 13/353,644 filed on Jan. 19, 2012 (now U.S. Pat. No. 8,907,469 issued on Dec. 9, 2014). The contents of the above-referenced matters are hereby incorporated by reference in their entirety.

TECHNICAL FIELD

The present disclosure relates generally to an integrated circuit package and more particularly a package-on-package (POP).

BACKGROUND

Package on Package (POP) is an integrated circuit packaging technique to allow vertically combining multiple packages, e.g., discrete logic and memory ball grid array (BGA) packages. Two or more packages are mounted on top of one another, i.e. stacked, with an electrical interface to route electrical signals between them. This allows higher density integrated circuit chips usable in mobile devices, for example in mobile telephones or Personal digital assistants (PDA). However, due to different materials used in the combined multiple packages, the POP structure may have thermal (heat) related issues such as heat dissipation or mismatched thermal expansion coefficients.

BRIEF DESCRIPTION OF THE DRAWINGS

Reference is now made to the following descriptions taken in conjunction with the accompanying drawings, in which.

DETAILED DESCRIPTION

Figure 1:
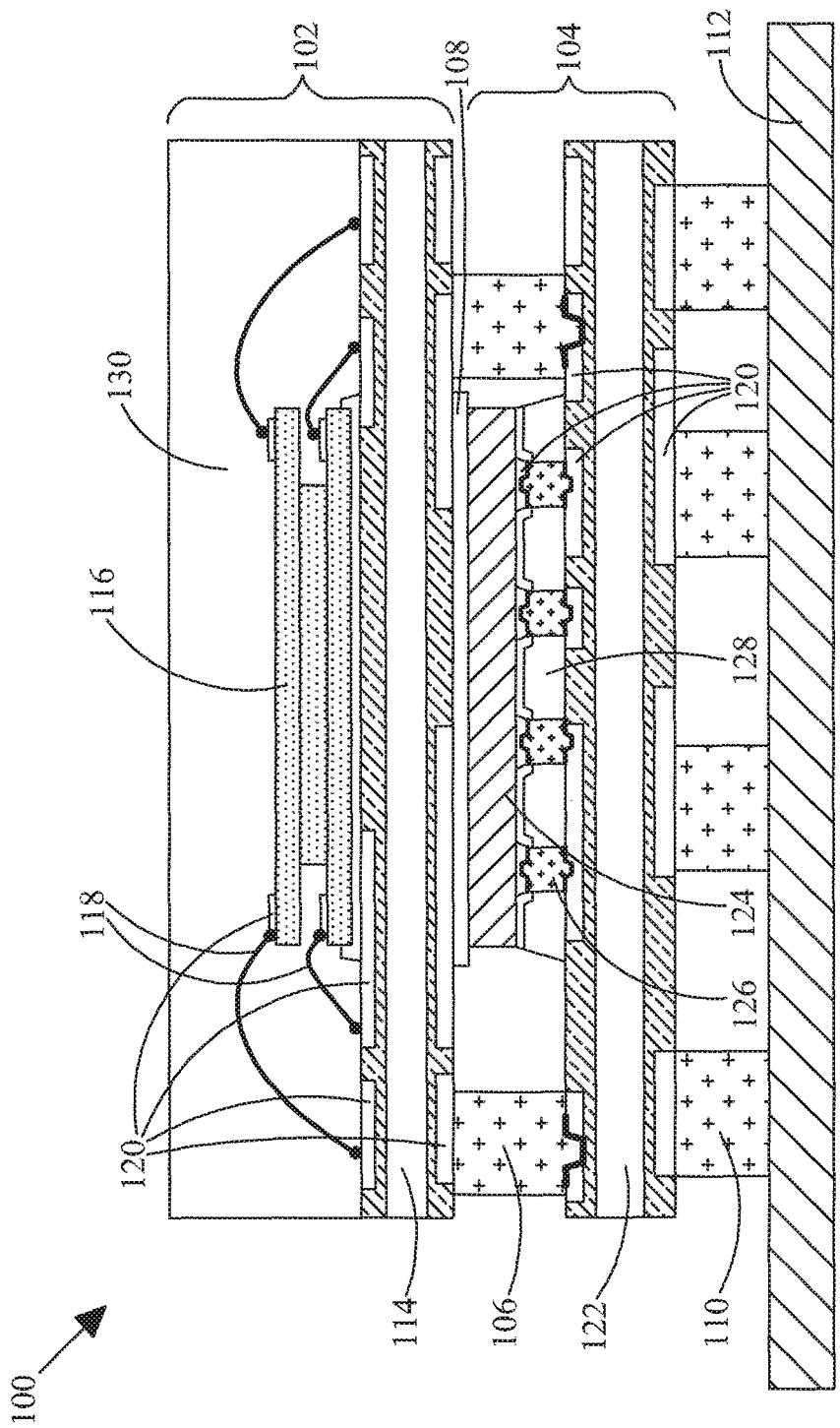
FIG. 1 is a schematic diagram of an exemplary package-on-package (POP) assembly according to some embodiments.

The making and using of various embodiments are discussed in detail below. It should be appreciated, however, that the present disclosure provides many applicable inventive concepts that can be embodied in a wide variety of specific contexts. The specific embodiments discussed are illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary package-on-package (POP) assembly 100 according to some embodiments. The POP assembly 100 includes a top integrated circuit package ("top package") 102, a bottom integrated circuit package ("bottom package") 104, solder bumps (solder balls) 106 and 110 for ball grid array (BGA) packaging, a buffer layer 108, and a printed circuit board (PCB) 112. (The solder bumps 106 and 110 are not considered part of the bottom package 104.) The top package 102 includes a top integrated circuit die ("top die") 116 (flip chip package in this example), bond wires 118 to electrically connect the top die 116 to a top substrate 114 using some pads 120 on the top substrate 114. Molding compound 130 encapsulate the top die 116 and bond wires 118. Bond wires 118 and pads 120 can comprise aluminium, copper, gold, or any other suitable electrically conductive material.

The bottom package 104 includes a bottom die 124 mounted on a bottom substrate 122 with micro bumps (such as a Controlled Collapse Chip Connection bump or sometimes also referred to as a C4 bumps) 126 for electrical connection. Underfill 128 (e.g., epoxy mixture) fills the gap between the bottom die 124 and the bottom substrate 122. The bottom substrate 122 is mounted on the PCB 112 with solder bumps 110 for electrical connection. Some pads 120 provide electrical contact surfaces for solder bumps 106 and 110.

The solder bumps 106 and 110 provide electrical signal connections between the top package 102 and the bottom package 104, or between the bottom package 104 and the PCB 112. The solder bumps 106 and 110 can comprise SAC405 (Sn/4.0Ag/0.5Cu), SAC105 (Sn/1.0Ag/0.5Cu), other SnCu based materials, or any other suitable materials. The top substrate 114 and the bottom substrate 122 can comprise organic material, Si interposer, or any other suitable material.

The buffer layer 108 can be formed over the bottom die 124 to absorb the stress between the top package 102 and the bottom package 104, caused by coefficient of thermal expansion (CTE) mismatch among various parts of the package assembly, e.g., the top substrate 114, the bottom die 124, and the solder bumps 106, among others. The buffer layer 108 can comprise polymer material with good thermal conductivity for heat dispassion, e.g., at least 1.0 W/° C.·m. The buffer layer 108 can be formed by spin coating on the bottom die 124. In some embodiments, the buffer layer 108 is formed on the bottom integrated circuit wafer of the bottom die 124 before die sawing. In some embodiments, the buffer layer 108 is formed under the bottom of the top package 102.

In one example, the top package 102 has a thickness of about 500 μm with a size of about 12×12 mm, the top substrate 114 has a thickness of about 175 μm (with a size of about 12×12 mm), the bottom substrate 122 has a thickness of about 250 μm (with a size of about 12×12 mm), the bottom die 124 and the underfill 128 has a combined thickness of about 190 μm, and the solder bumps (BGA balls) 106 and 110 has a thickness of about 190 μm with a size of about 240 μm. The buffer layer 108 has a dimension similar to the bottom die 124, and the thickness of the buffer layer 108 (e.g., about 80 μm) is identical to the gap between the bottom die 124 and the top package 102. The dimensions and sizes of the elements in the POP assembly 100 vary depending on the integrated circuit design.

The POP assembly 200 has a relatively low profile, better signal integrity from relatively low IR drop due to shorter electrical path compared to some other packaging methods. And the POP assembly 100 also has a higher thermal conductivity due to more heat transfer area provided by the buffer layer 108. Even though two packages (the top package 102 and the bottom package 104) in the POP assembly 100 are mounted on the PCB 112, different number of packages can be mounted on the PCB 112, and the buffer layer 108 can be used on multiple planes.

Figure 2:
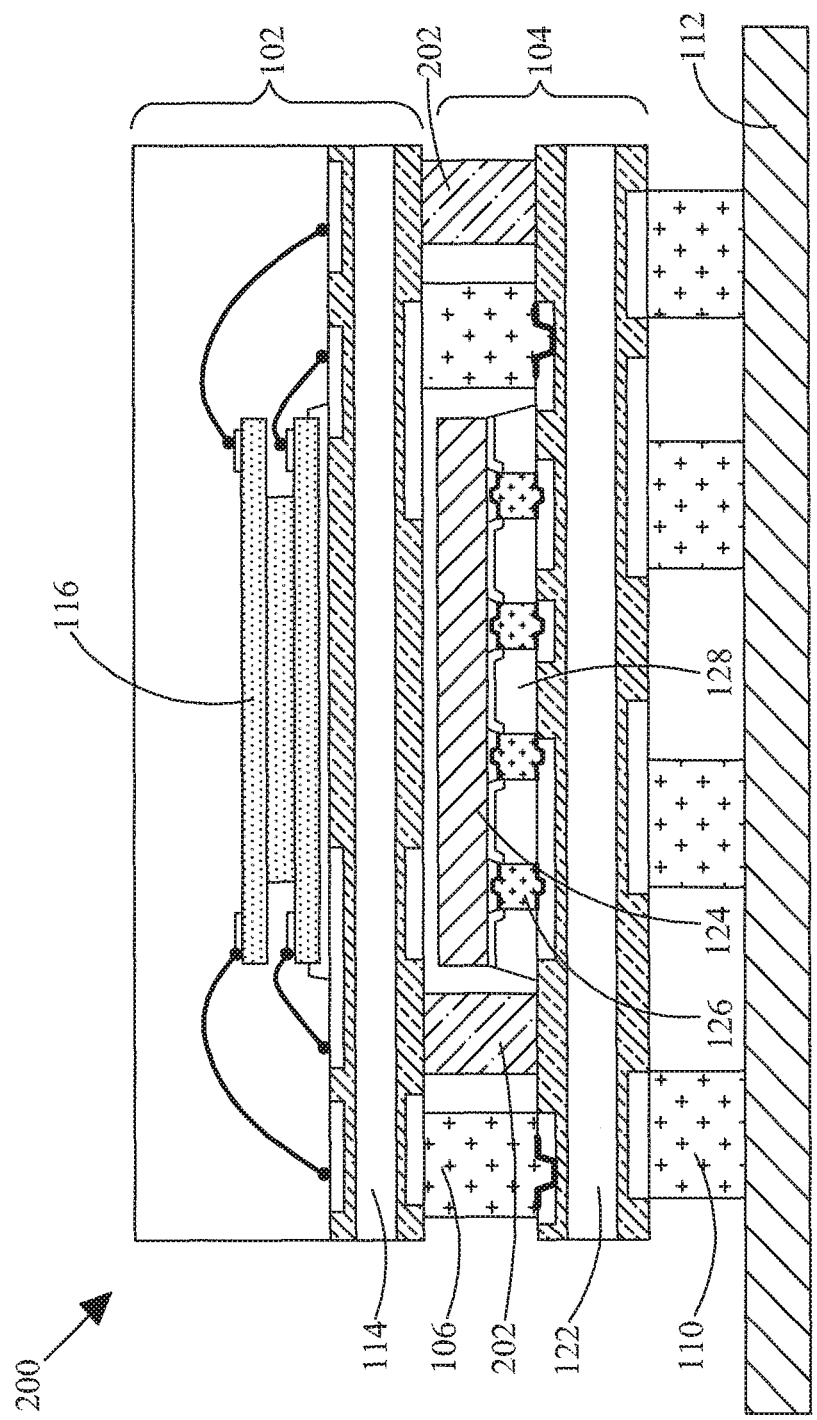
FIG. 2 is a schematic diagram of another exemplary POP assembly according to some embodiments.

FIG. 2 is a schematic diagram of another exemplary POP assembly according to some embodiments. The POP assembly 200 includes stub blocks 202 instead of the buffer layer 108 in FIG. 1. The stub blocks 202 can be placed on the bottom package 104 surface (the bottom substrate 122) through stencil control, which is similar to BGA ball drop in the same plane. The stub blocks 202 are positioned at locations where there is no solder bump 106.

The stub block 202 can comprise solder material identical to solder bumps 106 and 110 (BGA balls) or different material with higher melting temperature compared to solder bumps 106 and 110. In some embodiments, the stub blocks 202 have melting temp (Tm) that is 10° C. greater than the solder bumps 106 and 110. For example, the solder bumps 106 or 110 using SAC405 have its melting temperature at 217° C., while the stub blocks 202 using SAC105 have melting temperature at 230° C. and the stub blocks 202 using Sn-0.7Cu (Sn 99.3% and Cu 0.7%) have melting temperature at 227° C.

While the solder bumps 106 and 110 are designed for electrical signal connections (integrated circuit function), the stub blocks 202 are designed to reinforce the mechanical strength of the POP assembly 200 and help its thermal management. Also, the stub blocks 202 between the top package 102 and the top die 124 of the bottom package 104 help to control the CTE induced warpage in the POP assembly 200. In some embodiments, the stub blocks 202 have a width and length of about 100 μm-300 μm. The stub blocks 202 can have different shapes (such as circular, square, rectangular, etc.) and various dimensions depending on the locations and/or applications.

The POP assembly 200 has a higher thermal conductivity compared to conventional structures due to more heat transfer area provided by the stub blocks 202. Even though two packages (the top package 102 and the bottom package 104) in the POP assembly 200 are mounted on the PCB 112, different number of packages can be mounted on the PCB 112, and the stub blocks 202 can be used on multiple planes.

Figure 3:
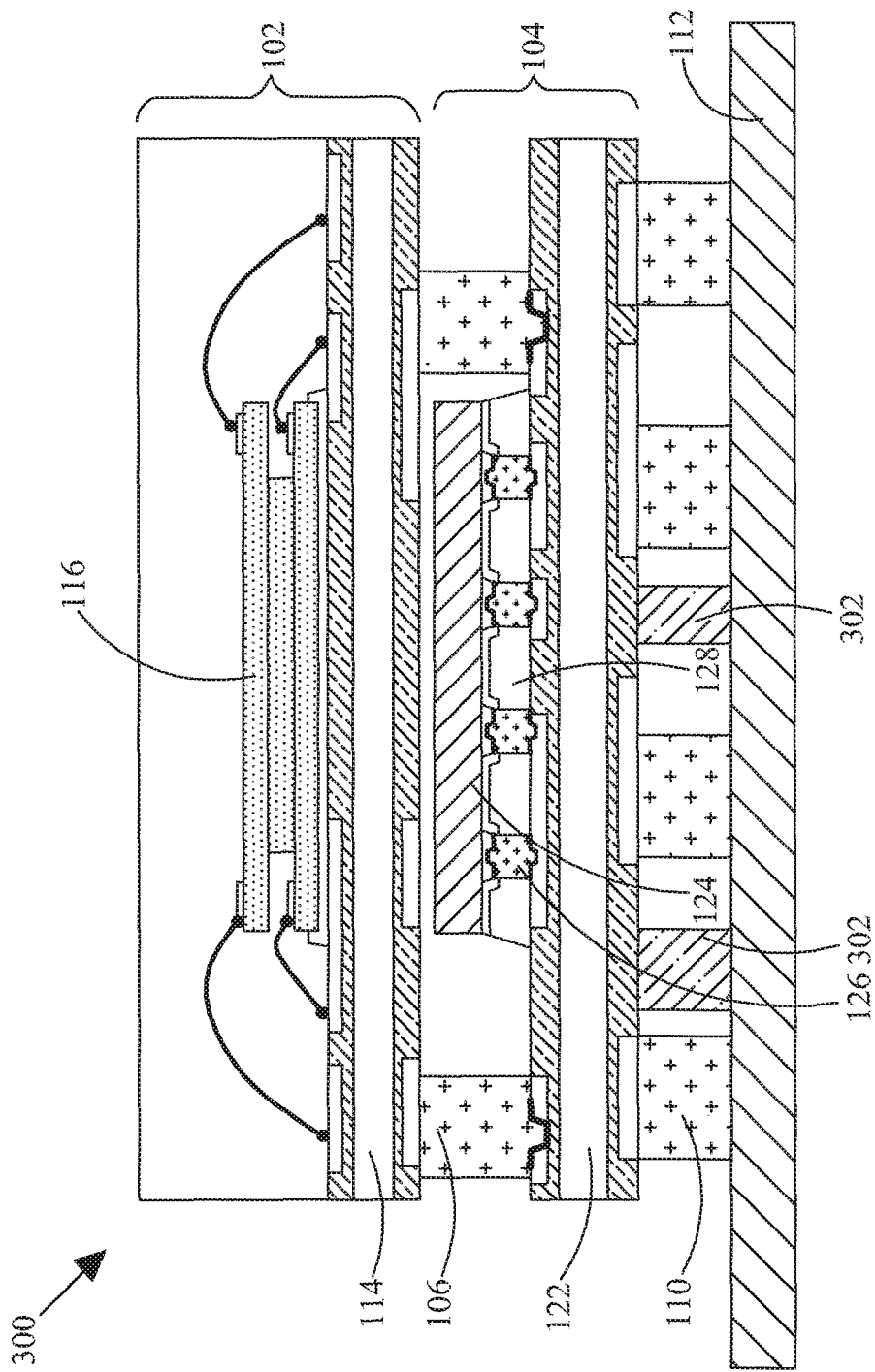
FIG. 3 is a schematic diagram of yet another exemplary POP assembly according to some embodiments.

FIG. 3 is a schematic diagram of yet another exemplary POP assembly according to some embodiments. The POP assembly 300 includes stub blocks 302 between the bottom package 104 and the PCB 112 instead of between the top package 102 and the bottom package 104 in FIG. 2. The stub blocks 302 can be placed on the PCB 112 surface through stencil control (at locations where there is no solder bump 110), which is similar to BGA ball drop in the same plane.

Figure 4:
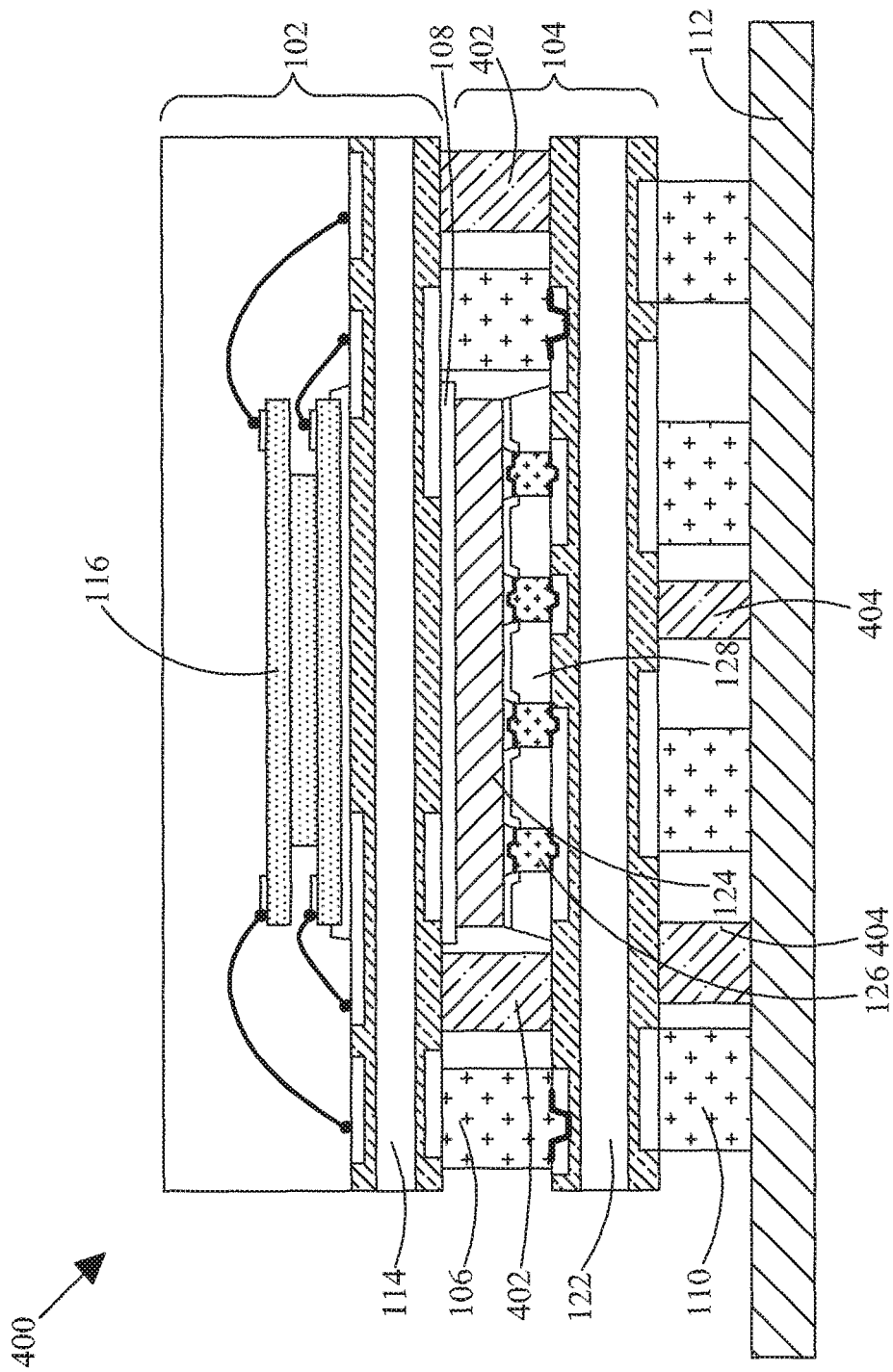
FIG. 4 is a schematic diagram of yet another exemplary POP assembly according to some embodiments.

FIG. 4 is a schematic diagram of yet another exemplary POP assembly according to some embodiments. The POP assembly 400 includes the buffer layer 108, stub blocks 402 between the top package 102 and the bottom package 104, and stub blocks 404 between the bottom package 104 and the PCB 112.

Figure 5:
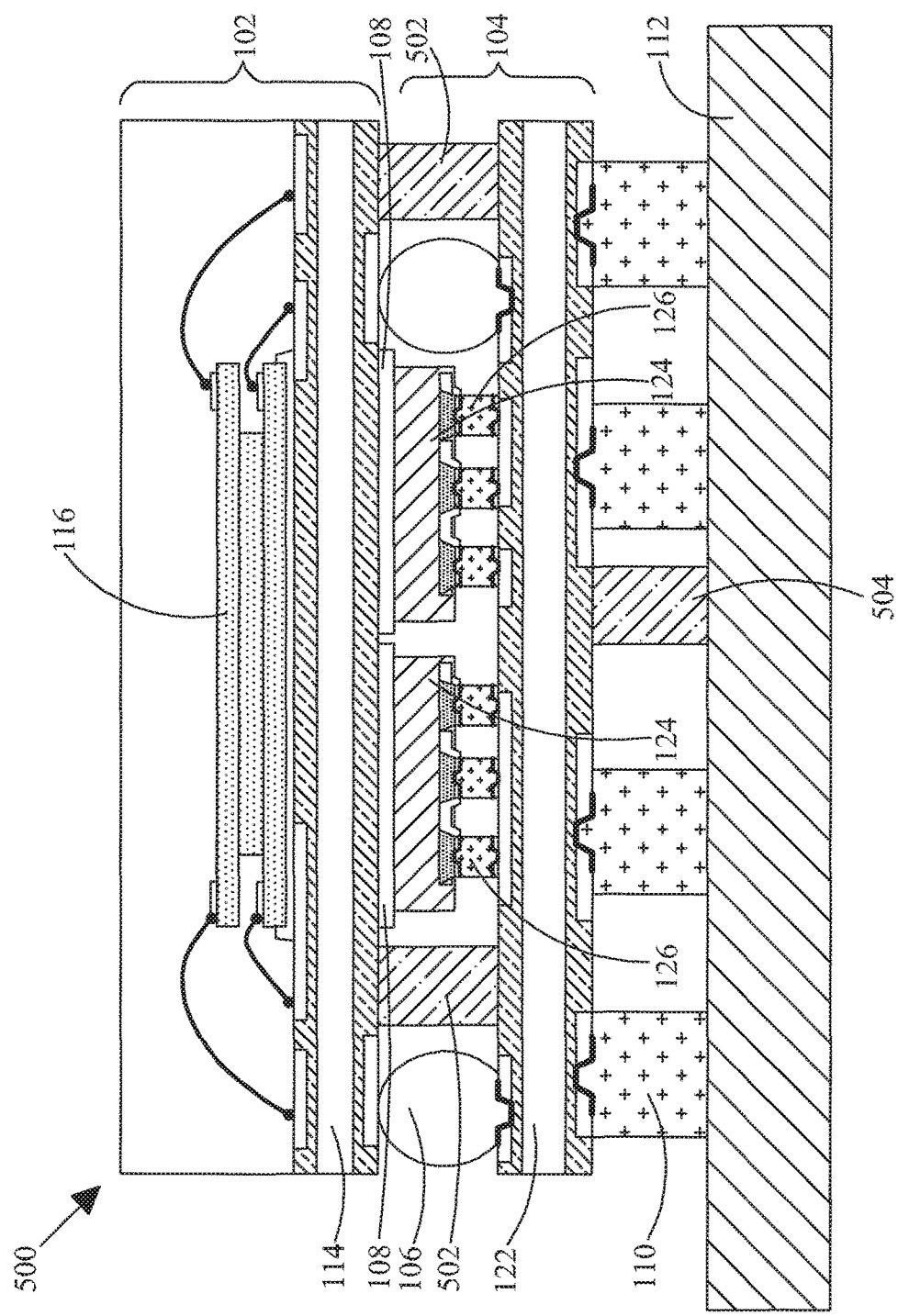
FIG. 5 is a schematic diagram of yet another exemplary POP assembly according to some embodiments.

FIG. 5 is a schematic diagram of yet another exemplary POP assembly according to some embodiments. The bottom package 104 in the POP assembly 500 includes multiple bottom dies 124 mounted on the bottom substrate 122 using micro bumps 126. The buffer layers 108, stub blocks 502 between the top package 102 and the bottom package 104, and stub blocks 504 between the bottom package 104 and the PCB 112 help to reinforce the mechanical strength of the POP assembly 500 and its thermal management. Also, the stub blocks 502 and 504 help to control the CTE induced warpage in the POP assembly 500.

Figure 6:
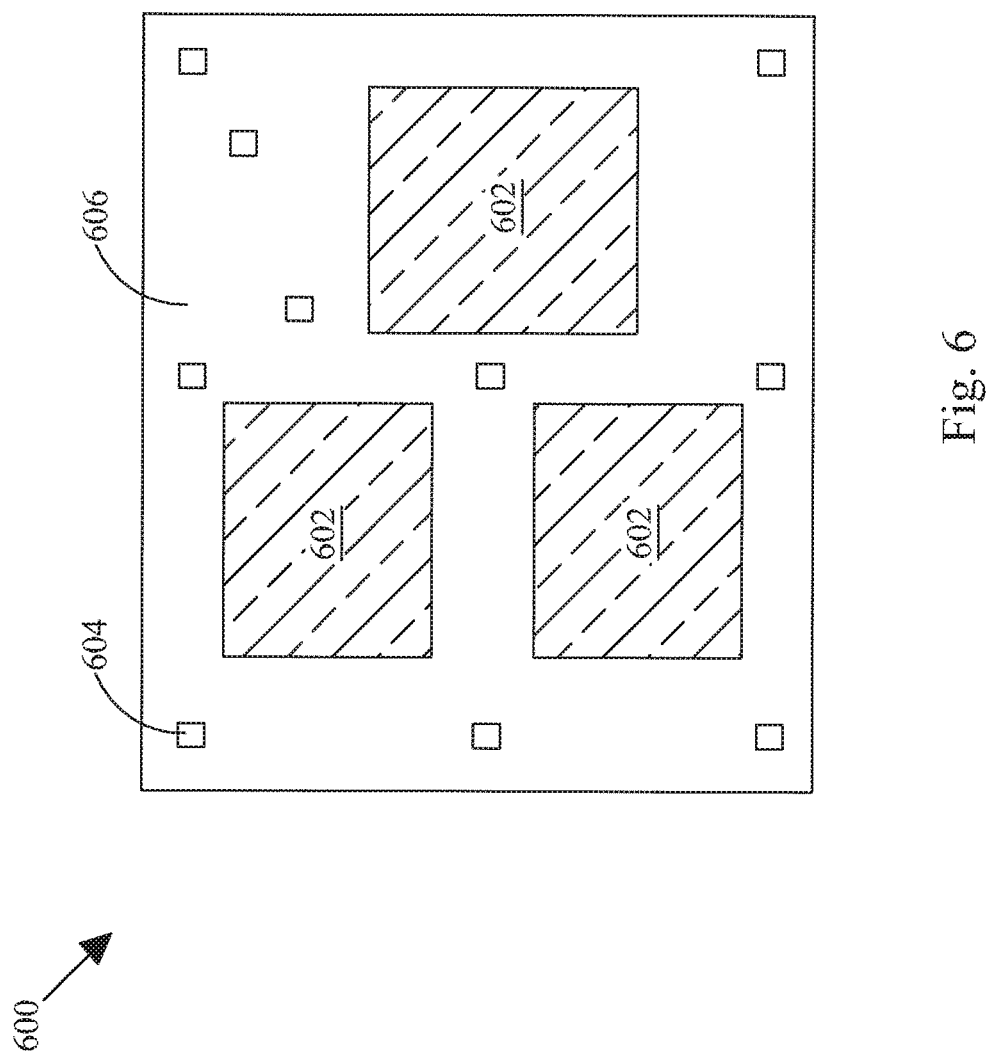
FIG. 6 is a layout of an exemplary POP assembly according to some embodiments.

FIG. 6 is a layout of an exemplary POP assembly according to some embodiments. The layout 600 includes multiple bottom dies 602 located throughout the layout area 606 and stub blocks 604 are positioned at various locations to reinforce the mechanical strength and help thermal management of the POP assembly layout 600. The stub blocks 604 can be placed in various positions depending on allowed design rules and other requirements of different applications.

Figure 7:
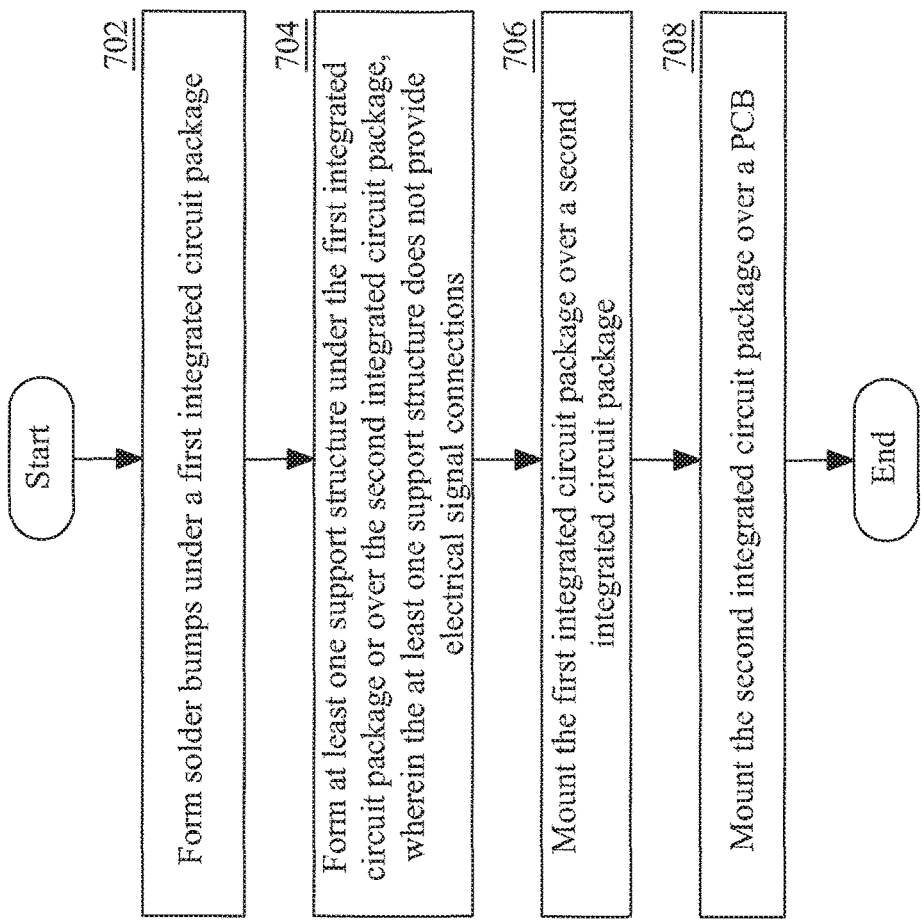
FIG. 7 is a flowchart of an exemplary method of fabricating a POP assembly according to some embodiments.

FIG. 7 is a flowchart of a method of fabricating an exemplary POP assembly according to some embodiments. At step 702, solder bumps are formed under a first integrated circuit package. Solder bumps can be, for example, BGA solder balls. At step 704, at least one first support structure is formed under the first integrated circuit package or over a second integrated circuit package, wherein the at least one first support structure does not provide electrical signal connections among electrical components of the first integrated circuit package and the second integrated circuit package. The first support structure can be, for example, the buffer layer 108 in FIG. 1 or the stub blocks 202 in FIG. 2. At step 706, the first integrated circuit package is mounted over a second integrated circuit package, e.g., by BGA mount technique. At step 708, the second integrated circuit package over a printed circuit board, e.g., by surface mount technology (SMT).

In various embodiments, the at least one first support structure comprises a buffer layer formed over a die in the second integrated circuit package. In other embodiments, the buffer layer comprises polymer having thermal conductivity at least 1.0 W/° C.·m.

In various embodiments, the at least one first support structure comprises stub blocks disposed in locations where there is no solder bump. The stub blocks are formed at the same time as the solder bumps in some examples. At least one second support structure is formed under the second integrated circuit package or over the printed circuit board, wherein the at least one second support structure does not provide electrical signal connections. The second support structure can be, for example, the stub blocks 302 in FIG. 3. Details of the buffer layer 108 and the stub blocks 202 and 302 are as previously described above.

According to some embodiments, a package-on-package (POP) assembly includes a first integrated circuit package and a second integrated circuit package disposed under the first integrated circuit package. Solder bumps are disposed between the first integrated circuit package and the second integrated circuit package providing electrical signal connections between the first integrated circuit package and the second integrated circuit package. At least one support structure is disposed between the first integrated circuit package and the second integrated circuit package to facilitate thermal conduction between the first integrated circuit package and the second integrated circuit package without providing electrical signal connections.

According to some embodiments, a method of fabricating a package-on-package (POP) assembly includes forming solder bumps under a first integrated circuit package. At least one support structure is formed under the first integrated circuit package or over the second integrated circuit package, wherein the at least one support structure does not provide electrical signal connections. The first integrated circuit package is mounted over a second integrated circuit package.

An aspect of this description relates to an integrated circuit package assembly that comprises a substrate and a first integrated circuit package over the substrate. The integrated circuit package assembly also comprises a second integrated circuit package between the first integrated circuit package and the substrate. The integrated circuit package further comprises solder bumps between the first integrated circuit package and the second integrated circuit package. The solder bumps are configured to electrically connect the first integrated circuit package and the second integrated circuit package. The integrated circuit package assembly further comprises at least two support structures between and in direct contact with the second integrated circuit package and the substrate. The at least two support structures are configured to facilitate thermal conduction between the second integrated circuit package and the substrate without providing electrical connections.

Another aspect of this description relates to integrated circuit package assembly that comprises a circuit board and a first integrated circuit package over the circuit board. The integrated circuit package assembly also comprises a second integrated circuit package between the first integrated circuit package and the circuit board. The integrated circuit package assembly further comprises solder bumps between the first integrated circuit package and the second integrated circuit package. The solder bumps are configured to electrically connect the first integrated circuit package and the second integrated circuit package. The integrated circuit package additionally comprises a buffer layer between the first integrated circuit package and the second integrated circuit package. The buffer layer is configured to facilitate thermal conduction between the first integrated circuit package and the second integrated circuit package. The integrated circuit assembly package also comprises stub blocks between and in direct contact with the second integrated circuit package and the circuit board to facilitate thermal conduction between the second integrated circuit package and the circuit board without providing electrical connections.

A further aspect of this description is related to an integrated circuit package assembly that comprises a substrate and a first integrated circuit package over the substrate. The integrated circuit package assembly also comprises a second integrated circuit package between the first integrated circuit package and the substrate. The integrated circuit package assembly further comprises solder bumps between the first integrated circuit package and the second integrated circuit package. The solder bumps are configured to provide electrical connections between the first integrated circuit package and the second integrated circuit package. The integrated circuit package assembly additionally comprises first support structures between and in direct contact with the first integrated circuit package and the second integrated circuit package. The first support structures are configured to facilitate thermal conduction between the first integrated circuit package and the second integrated circuit package without providing electrical connections. The integrated circuit package assembly also comprises second support structures between and in direct contact with the second integrated circuit package and the substrate. The second support structures are configured to facilitate thermal conduction between the second integrated circuit package and the substrate without providing electrical connections. A first quantity of the first support structures is different from a second quantity of the second support structures.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. An integrated circuit package assembly, comprising:
    a first integrated circuit package including a first integrated circuit die mounted on a first substrate;
    a second integrated circuit package including a second integrated circuit die mounted on a second substrate, the second integrated circuit package being disposed under the first integrated circuit package;
    solder bumps disposed between the first integrated circuit package and the second integrated circuit package providing electrical signal connections between the first integrated circuit die and the second integrated circuit die;
    a buffer layer disposed between the first substrate and the second integrated circuit die to facilitate thermal conduction between the first integrated circuit package and the second integrated circuit package; and
    wherein the solder bumps extend between the first substrate and the second substrate, and wherein the solder bumps have solder bump sidewalls that extend past outer sidewalls of the second integrated circuit die.

2. The integrated circuit package assembly of claim 1, wherein the buffer layer is configured to facilitate thermal conduction between the first integrated circuit package and the second integrated circuit package without providing electrical connections.

3. The integrated circuit package assembly of claim 2, wherein the buffer layer comprises a material different from the solder bumps.

4. The integrated circuit package assembly of claim 1, further comprising:
   first conductive pads on a surface of the first integrated circuit package facing the second integrated circuit package; and
   second conductive pads on a surface of the second integrated circuit package facing the first integrated circuit package,
   wherein at least one of the solder bumps is in contact with at least one first conductive pad of the first conductive pads and at least one second conductive pad of the second conductive pads.

5. The integrated circuit package assembly of claim 4, wherein at least two of the solder bumps are arranged on opposite sides of the buffer layer, and a plane passing through the buffer layer in parallel with an upper surface of the buffer layer also passes through the at least two of the solder bumps.

6. The integrated circuit package assembly of claim 4, wherein the second integrated circuit package comprises:
   micro bumps between the second integrated circuit die and at least two second conductive pads of the second conductive pads that are free from being in contact with the solder bumps,
   wherein the micro bumps are configured to electrically connect the second integrated circuit die with the second conductive pads in contact with the micro bumps.

7. The integrated circuit package assembly of claim 6, wherein the micro bumps have a thickness between the second integrated circuit die and the second integrated circuit package smaller than a thickness of the solder bumps between the first integrated circuit package and the second integrated circuit package.

8. An integrated circuit package assembly, comprising:
   a first integrated circuit package comprising a first substrate, the first substrate comprising a lower surface, and the lower surface comprising a first portion having one or more pads and a second portion having no pad;
   a second integrated circuit package comprising a second substrate, the second substrate comprising an upper surface, and the upper surface comprising a first portion having one or more pads and a second portion having no pad;
   one or more solder bumps between the first integrated circuit package and the second integrated circuit package, one of the one or more solder bumps connecting one of the one or more pads of the first integrated circuit package and a corresponding one of the one or more pads of the second integrated circuit package; and
   a buffer layer disposed between the first substrate and the second substrate to facilitate thermal conduction between the first integrated circuit package and the second integrated circuit package.

9. The integrated circuit package assembly of claim 8, wherein the buffer layer has a thickness configured to fill a gap between a lower surface of the first integrated circuit package and an upper surface of the second integrated circuit package.

10. The integrated circuit package assembly of claim 8, further comprising:
    at least two support structures between and in direct contact with the second integrated circuit package and the substrate, the at least two support structures being configured to facilitate thermal conduction between the second integrated circuit package and the substrate without providing electrical connections.

11. The integrated circuit package assembly of claim 10, wherein the buffer layer comprises a material different from the solder bumps and different from the at least two support structures.

12. The integrated circuit package assembly of claim 10, wherein the at least two support structures comprise a same material as the solder bumps.

13. The integrated circuit package assembly of claim 10, wherein the at least two support structures are arranged about an outer perimeter of the buffer layer.

14. The integrated circuit package assembly of claim 10, further comprising:
    conductive pads on a surface of the second integrated circuit package facing the substrate,
    wherein the at least two support structures are in contact with the second integrated circuit package and the substrate independent from the conductive pads.

15. An integrated circuit package assembly, comprising:
    a printed circuit board;
    a first integrated circuit package over the printed circuit board, the first integrated circuit package including a first integrated circuit die mounted on a first substrate;
    a second integrated circuit package between the first integrated circuit package and the printed circuit board, the second integrated circuit package including a second integrated circuit die mounted on a second substrate;
    solder bumps between the first integrated circuit package and the second integrated circuit package, the solder bumps being configured to electrically connect the first integrated circuit die and the second integrated circuit die;
    a buffer layer disposed between the first substrate and the second integrated circuit die to facilitate thermal conduction between the first integrated circuit package and the second integrated circuit package; and
    stub blocks between and in direct contact with the second integrated circuit package and the printed circuit board.

16. The integrated circuit package assembly of claim 15, wherein the stub blocks facilitate thermal conduction between the second integrated circuit package and the circuit board without providing electrical connections.

17. The integrated circuit package assembly of claim 16, wherein the buffer layer facilitates thermal conduction between the first integrated circuit package and the second integrated circuit package without providing electrical connections.

18. The integrated circuit package assembly of claim 16, wherein the buffer layer comprises a material different from the stub blocks.

19. The integrated circuit package assembly of claim 16, wherein the stub blocks comprise a material having a higher melting temperature than the solder bumps.

20. The integrated circuit package assembly of claim 15, wherein the second integrated circuit package comprises:
    a semiconductor die on a first integrated circuit package side of the second integrated circuit package; and
    micro bumps between the semiconductor die and at least two second conductive pads of the second conductive pads that are free from being in contact with the solder bumps, wherein the micro bumps are configured to electrically connect the semiconductor die with the second conductive pads in contact with the micro bumps.

\* \* \* \* \*